US012804844B2

(12) United States Patent
Shimizu

(10) Patent No.: US 12,804,844 B2
(45) Date of Patent: Nov. 17, 2026

(54) SEMICONDUCTOR STORAGE DEVICE WITH IMPROVED AIR FLOW

(71) Applicant: Kioxia Corporation, Tokyo (JP)

(72) Inventor: Keishi Shimizu, Yokohama (JP)

(73) Assignee: KIOXIA CORPORATION, Tokyo (JP)

( * ) Notice: Subject to any disclaimer, the term of this patent is extended or adjusted under 35 U.S.C. 154(b) by 475 days.

(21) Appl. No.: 18/459,771

(22) Filed: Sep. 1, 2023

(65) Prior Publication Data

US 2024/0098930 A1 Mar. 21, 2024

(30) Foreign Application Priority Data

Sep. 16, 2022 (JP) ................................. 2022-148071

(51) Int. Cl.
*H05K 7/20* (2006.01)
*H10B 80/00* (2026.01)
*H10W 90/00* (2026.01)

(52) U.S. Cl.
CPC ......... *H05K 7/20145* (2013.01); *H10B 80/00* (2023.02); *H10W 90/00* (2026.01)

(58) Field of Classification Search
CPC ... H05K 7/20145; H01L 25/165; H10B 80/00
See application file for complete search history.

(56) References Cited

U.S. PATENT DOCUMENTS

| | | | | |
|---|---|---|---|---|
| 8,451,600 B1 | 5/2013 | Ross | | |
| 9,883,615 B2 * | 1/2018 | Yoshinaga | ......... | H05K 7/20754 |
| 10,314,160 B2 | 6/2019 | Suzuki et al. | | |
| 10,937,464 B2 * | 3/2021 | Long | .................... | G11B 33/142 |
| 11,785,703 B2 * | 10/2023 | Nagasawa | .............. | H05K 1/181 361/679.31 |
| 2021/0015006 A1 * | 1/2021 | Muto | ....................... | H05K 5/13 |
| 2022/0087072 A1 * | 3/2022 | Matsuda | ............ | H05K 7/20509 |
| 2024/0046965 A1 * | 2/2024 | Awaga | ................. | H05K 1/0203 |

FOREIGN PATENT DOCUMENTS

| | | |
|---|---|---|
| JP | 2018-152524 A | 9/2018 |
| JP | 2021-012993 A | 2/2021 |
| JP | 2022-049327 A | 3/2022 |

* cited by examiner

*Primary Examiner* — Zachary Pape
(74) *Attorney, Agent, or Firm* — Foley & Lardner LLP

(57) ABSTRACT

A semiconductor storage device includes a housing, a substrate, a first semiconductor component, a capacitor, and a first regulating plate. The substrate is accommodated in the housing. The first semiconductor component is mounted on the substrate. The capacitor on the substrate, the capacitor includes a portion that overlaps the first semiconductor component from a side opposite to the substrate when viewed in a first direction, which is a thickness direction of the substrate. The first regulating plate guides at least a part of air, which flows inside the housing, toward a gap between the capacitor and the substrate.

15 Claims, 9 Drawing Sheets

SEMICONDUCTOR STORAGE DEVICE WITH IMPROVED AIR FLOW

CROSS-REFERENCE TO RELATED APPLICATION(S)

This application is based upon and claims the benefit of priority from Japanese Patent Application No. 2022-148071, filed Sep. 16, 2022, the entire contents of which are incorporated herein by reference.

FIELD

Embodiments described herein relate generally to a semiconductor storage device.

BACKGROUND

A semiconductor storage device including a housing, a substrate accommodated in the housing, a semiconductor component mounted on the substrate, and a capacitor mounted on the substrate, is known.

DETAILED DESCRIPTION

Figure 1:
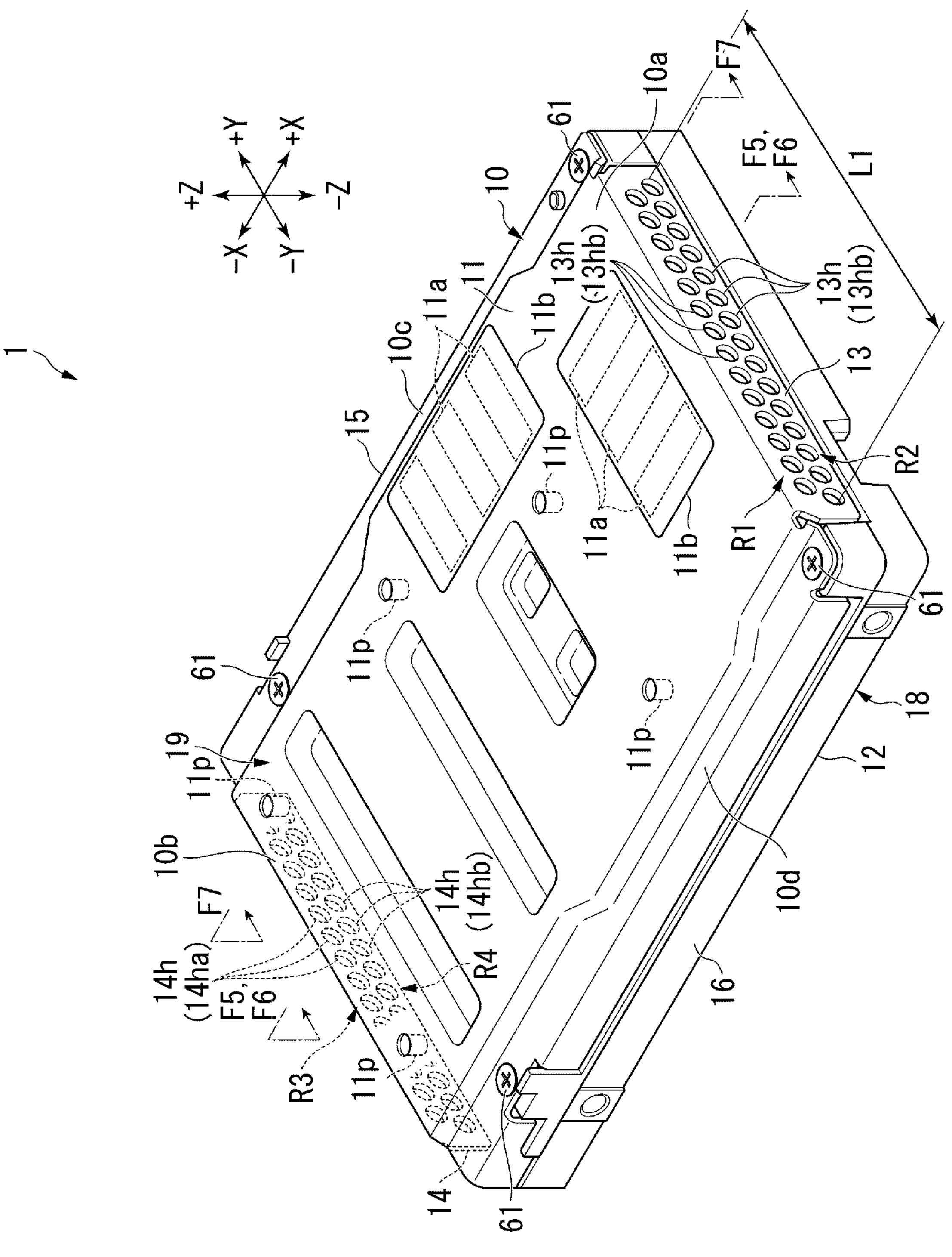
FIG. 1 is a perspective view showing a semiconductor storage device according to at least one embodiment.

At least one embodiment provides a semiconductor storage device that can improve a heat dissipation property.

In general, according to at least one embodiment, the semiconductor storage device includes a housing, a substrate, a first semiconductor component, a capacitor, and a first regulating plate. The substrate is accommodated in the housing. The first semiconductor component is mounted on the substrate. The capacitor on the substrate, the capacitor includes a portion that overlaps the first semiconductor component from a side opposite to the substrate when viewed in a first direction, which is a thickness direction of the substrate. The first regulating plate guides at least a part of air, which flows inside the housing, toward a gap between the capacitor and the substrate.

Hereinafter, the semiconductor storage device of the embodiment will be described with reference to the drawings. In the following description, configurations having the same or similar functions are designated by the same reference numerals. Further, a redundant description of those configurations may be omitted. In the present application, the terms "parallel", "perpendicular", or "same" may include "substantially parallel", "substantially perpendicular", or "substantially the same", respectively. In the present application, the term "connection" is not limited to mechanical connection, and may include electrical connection. That is, the term "connection" is not limited to direct connection with a target object, but may include connection with a target object with another member interposed therebetween. In the present application, the term "regulating" is not limited to regulating the flow of the air, but broadly means guiding (for example, directing) the flow of the air. Therefore, the term "regulating plate" used in the present application may be appropriately read as "air guide portion" or "air guide plate". In the present application, "overlapping" may also include cases where parts overlap each other.

The +X direction, −X direction, +Y direction, −Y direction, +Z direction, and −Z direction used in the following description will be defined. The +X direction, −X direction, +Y direction, and −Y direction are directions parallel to a first main wall 11 (see FIG. 1) of the housing 10. The +X direction is a direction from a second end portion 10*b* of the housing 10 toward a first end portion 10*a* (see FIG. 1). The −X direction is a direction opposite to the +X direction. When the +X direction and the −X direction are not distinguished, they are simply referred to as an "X direction". The +Y direction and the −Y direction are directions that intersect (for example, are perpendicular to) the X direction. The +Y direction is a direction from a fourth end portion 10*d* of the housing 10 to a third end portion 10*c* (see FIG. 1). The −Y direction is a direction opposite to the +Y direction. When the +Y direction and the −Y direction are not distinguished, both directions are simply referred to as a "Y direction".

Figure 2:
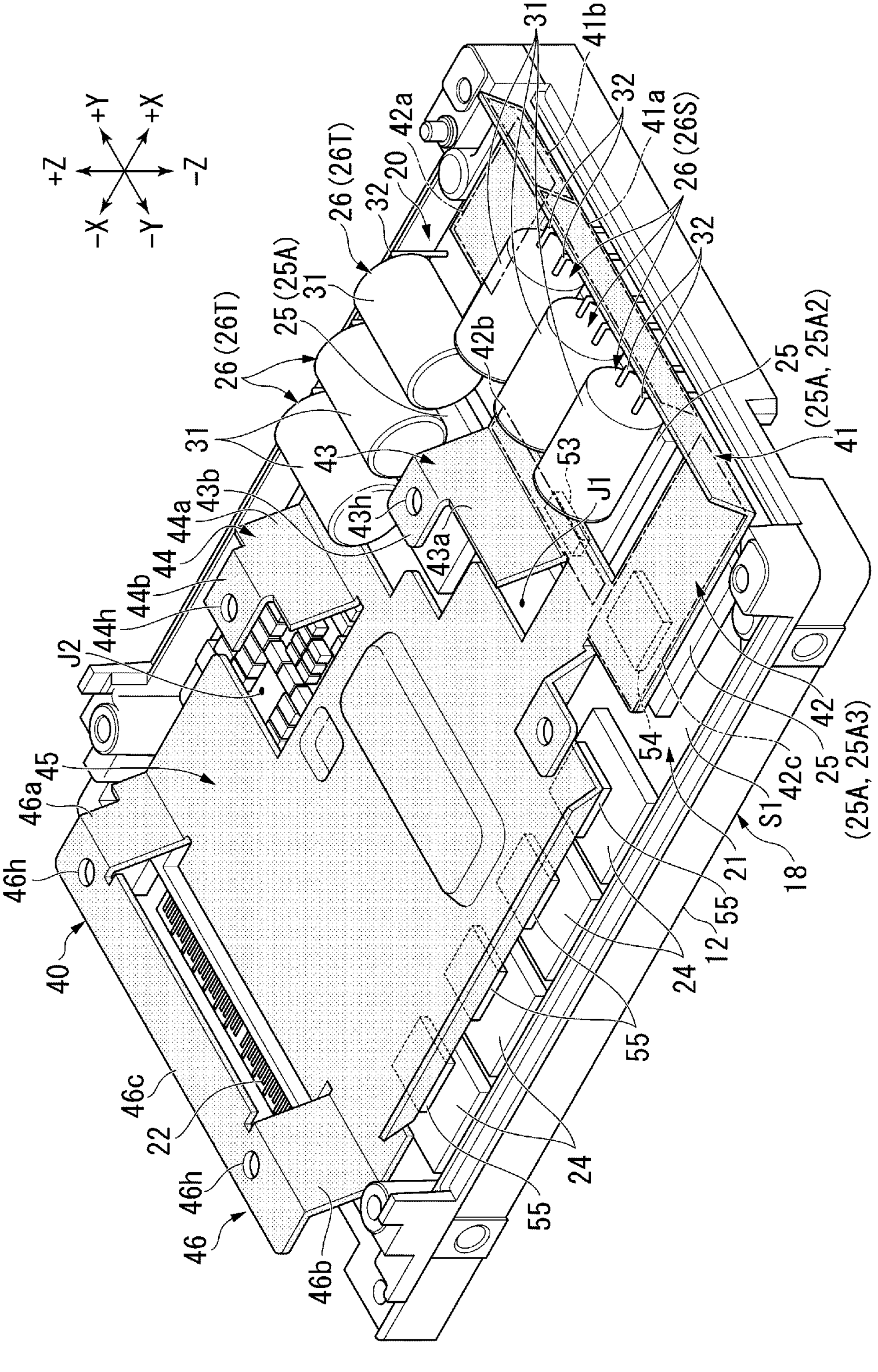
FIG. 2 is a perspective view showing an inside of a housing of at least one embodiment.

The +Z direction and the −Z direction are directions that intersect (for example, are perpendicular to) the X direction and the Y direction, and are thickness directions of the substrate 21 (see FIG. 2). The +Z direction is a direction from the substrate 21 toward the first main wall 11 of the housing 10 (see FIG. 6). The −Z direction is a direction opposite to the +Z direction. When the +Z direction and the −Z direction are not distinguished, both directions are simply referred to as a "Z direction". In the following, for convenience of explanation, the +Z direction may be referred to as "up", the −Z direction may be referred to as "down", and a location in the Z direction may be referred to as a "height location". However, these representations do not define a direction of gravity. The Z direction is an example of a "first direction." The X direction is an example of a "second direction". The Y direction is another example of the "second direction" and is an example of a "third direction" when the X direction is the second direction.

Embodiment

1. Overall Configuration of Semiconductor Storage Device

A semiconductor storage device 1 according to at least one embodiment will be described with reference to FIGS. 1 to 8. The semiconductor storage device 1 is, for example, a storage device such as a solid state drive (SSD). The semiconductor storage device 1 is attached to, for example, an information processing device such as a server or a personal computer, and used as a storage area of the information processing device. In the present application, the information processing device to which the semiconductor storage device 1 is attached is referred to as a "host device".

FIG. 1 is a perspective view showing the semiconductor storage device 1. The semiconductor storage device 1 includes, for example, the housing 10, a substrate unit 20 (see FIG. 2), an inner plate 40 (see FIG. 2), and a plurality of fixing members 61.

2. Housing

First, the housing 10 will be described.

The housing 10 is a member that forms an outline of the semiconductor storage device 1. The housing 10 has, for example, a flat box shape along the X direction and the Y direction. The housing 10 is made of metal, for example. The housing 10 includes a first end portion 10*a* and a second end portion 10*b* as a pair of end portions separated in the longitudinal direction (the X direction) of the housing 10. The first end portion 10*a* is an end portion on the +X direction side. The second end portion 10*b* is an end portion on the −X direction side. The housing 10 includes a third end portion 10*c* and a fourth end portion 10*d* as a pair of end portions separated in the lateral direction (the Y direction) of the housing 10. The third end portion 10*c* is an end portion on the +Y direction side. The fourth end portion 10*d* is an end portion on the −Y direction side. Further, the housing 10 includes a first main wall 11, a second main wall 12, a first side wall 13, a second side wall 14, a third side wall 15, and a fourth side wall 16 as walls forming the outline of the semiconductor storage device 1.

First Main Wall

The first main wall 11 is located at an end portion of the housing 10 in the +Z direction side and is a wall along the X direction and the Y direction. The first main wall 11 has a larger area as compared to each of the first to fourth side walls 13, 14, 15, and 16.

The first main wall 11 includes, for example, one or more (for example, a plurality of) openings 11*a* and a sealing member 11*b*. The opening 11*a* penetrates the first main wall 11 in the Z direction. The opening 11*a* is disposed at a location overlapping a capacitor 26 (see FIG. 2), which will be described later, when viewed from the Z direction. An upper end portion of the capacitor 26 is inserted into the opening 11*a* (see FIG. 7). As a result, reduction of the thickness of the semiconductor storage device 1 having the large capacitor 26 mounted thereon can be achieved. The sealing member 11*b* is attached to a surface of the first main wall 11 from the +Z direction side and covers the opening 11*a*.

The first main wall 11 includes one or more (for example, plural) protrusions 11*p*. The protrusion 11*p* protrudes from the first main wall 11 toward the inside of the housing 10 in the −Z direction. For example, the protrusion 11*p* is engaged with through holes 43*h*, 44*h*, and 46*h* of the inner plate 40, which will be described later, and is fixed by caulking.

Second Main Wall

The second main wall 12 is located at an end portion of the housing 10 in the −Z direction side and is a wall along the X direction and the Y direction. The second main wall 12 has a larger area as compared to each of the first to fourth side walls 13, 14, 15, and 16. The substrate unit 20 and an inner plate 40, which will be described later, are disposed between the first main wall 11 and the second main wall 12 in the Z direction.

First to Fourth Side Walls

Each of the first side wall 13, the second side wall 14, the third side wall 15, and the fourth side wall 16 is a wall along the Z direction, and extends between the end portion of first main wall 11 and the end portion of second main wall 12.

The first side wall 13 is located at the first end portion 10*a* of the housing 10 and is a wall along the Y direction and the Z direction. The first side wall 13 includes a plurality of ventilation holes 13*h*. The ventilation hole 13*h* penetrates the first side wall 13 in the X direction and is open in the X direction. The plurality of ventilation holes 13*h* are arranged side by side in the Y direction and the Z direction. For example, the plurality of ventilation holes 13*h* include a plurality of ventilation holes 13*ha* arranged in a first row R1 and a plurality of ventilation holes 13*hb* arranged in a second row R2. Each of the first row R1 and the second row R2 is a row along the Y direction. In the first row R1, three or more ventilation holes 13*ha* are arranged side by side in the Y direction. The second row R2 is arranged on the −Z direction side of the first row R1. In the second row R2, three or more ventilation holes 13*hb* are arranged side by side in the Y direction.

The second side wall 14 is located at the second end portion 10*b* of the housing 10 and is a wall along the Y direction and the Z direction. The second side wall 14 includes a plurality of ventilation holes 14*h*. The ventilation hole 14*h* penetrates the second side wall 14 in the X direction and is open in the X direction. The plurality of ventilation holes 14*h* are arranged side by side in the Y direction and the Z direction. For example, the plurality of ventilation holes 14*h* include a plurality of ventilation holes 14*ha* arranged in a third row R3 and a plurality of ventilation holes 14*hb* arranged in a fourth row R4. Each of the third row R3 and the fourth row R4 is a row along the Y direction. In the third row R3, three or more ventilation holes 14*ha* are arranged side by side in the Y direction. The fourth row R4 is arranged on the −Z direction side of the third row R3. In the fourth row R4, three or more ventilation holes 14*hb* are arranged side by side in the Y direction.

The third side wall 15 is located at the third end portion 10*c* of the housing 10 and is a wall along the X direction and the Z direction. The third side wall 15 extends in the X direction between the end portion of the first side wall 13 in the +Y direction side and the end portion of the second side wall 14 in the +Y direction side and connects the first side wall 13 and the second side wall 14.

The fourth side wall 16 is located at the fourth end portion 10*d* of the housing 10 and is a wall along in the X direction and the Z direction. The fourth side wall 16 extends in the X direction between the end portion of the first side wall 13 in the −Y direction side and the end portion of the second side wall 14 in the −Y direction side and connects the first side wall 13 and the second side wall 14.

Base and Cover of Housing

In at least one embodiment, the housing 10 includes a base 18 and a cover 19 and is formed by combining the base 18 and the cover 19. The base 18 includes, for example, all of the second main wall 12 and a part of each of the first to fourth side walls 13, 14, 15, and 16. The cover 19 includes, for example, all of the first main wall 11 and another part of each of the first to fourth side walls 13, 14, 15, and 16. The base 18 and the cover 19 are fixed together by a fixing member 61. The base 18 and the cover 19 are made of metal, for example. The base 18 is an example of a "first housing member". The cover 19 is an example of a "second housing member".

FIG. 2 is a perspective view showing an inside of the housing 10. In at least one embodiment, the housing 10 accommodates the substrate unit 20 and the inner plate 40. The inner plate 40 is disposed, for example, between the substrate 21, which is provided in the substrate unit 20, and the cover 19 of the housing 10 (see FIG. 6).

3. Substrate Unit

Next, the substrate unit 20 will be described.

Figure 3:
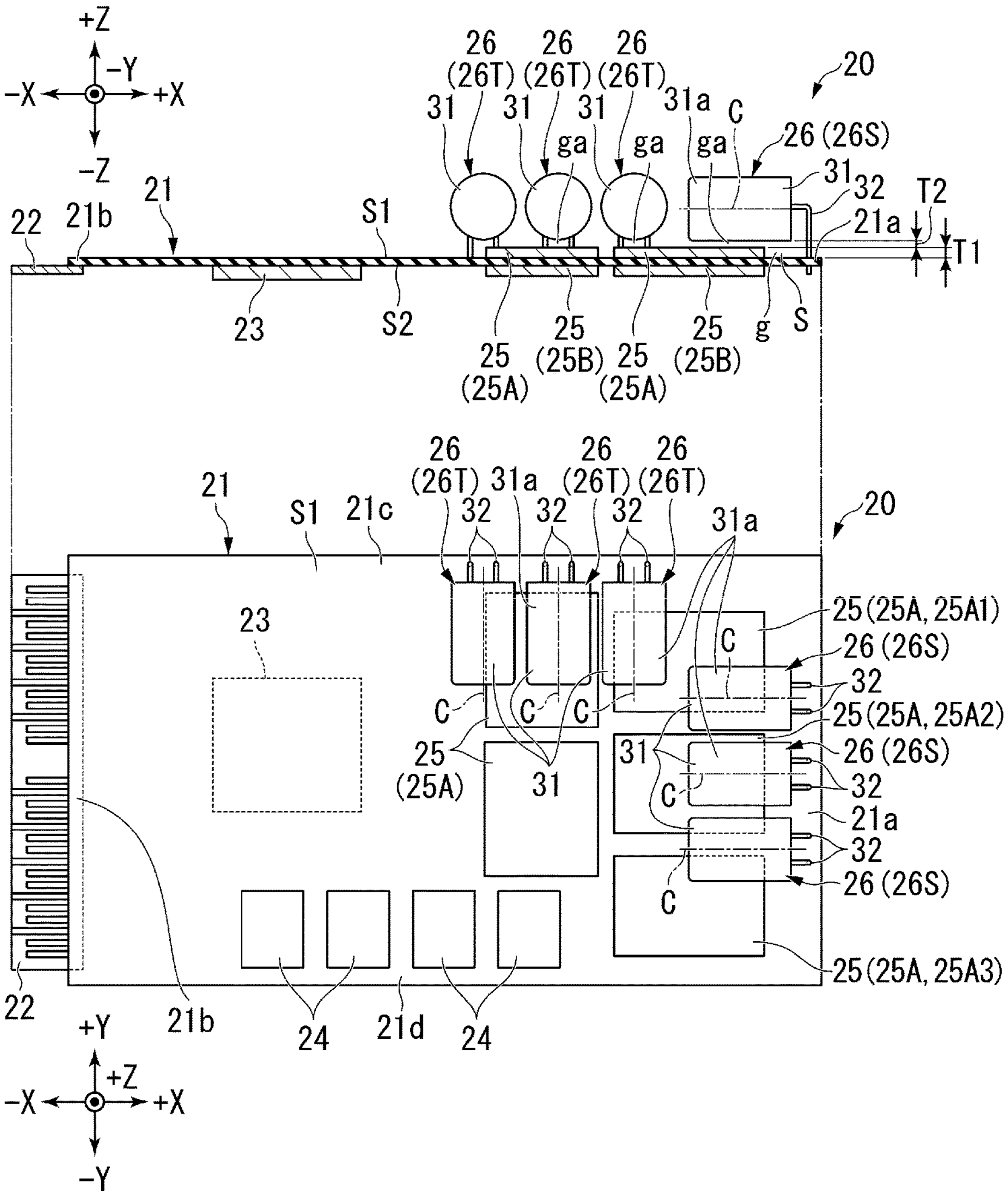
FIG. 3 is a diagram showing a substrate unit according to at least one embodiment.

FIG. 3 is a diagram showing the substrate unit 20. The substrate unit 20 includes, for example, the substrate 21, a connector 22, a controller 23, one or more dynamic random access memories (DRAMs) 24, one or more (for example, a plurality of) semiconductor memories 25, and one or more (for example, a plurality of) capacitors 26.

The substrate 21 is a plate member along the X direction and the Y direction. The substrate 21 is a printed substrate and includes an insulating base material and a wiring pattern provided on the insulating base material. The substrate 21 includes a first surface S1 and a second surface S2 that is located on a side opposite to the first surface S1. The first surface S1 is a surface that faces the +Z direction side. The second surface S2 is a surface that faces the −Z direction side.

The substrate 21 includes a first end portion 21*a* and a second end portion 21*b* as a pair of end portions separated in the longitudinal direction (the X direction) of the substrate 21. The first end portion 21*a* is an end portion on the +X direction side. The second end portion 21*b* is an end portion on the −X direction side. The substrate 21 includes a third end portion 21*c* and a fourth end portion 21*d* as a pair of end portions separated in the lateral direction (the Y direction) of the substrate 21. The third end portion 21*c* is an end portion on the +Y direction side. The fourth end portion 21*d* is an end portion on the −Y direction side.

The connector 22 is a connector that is connected to a host device. The connector 22 includes a plurality of metal terminals connectable with the host device. The connector 22 is provided on the second end portion 21*b* of the substrate 21.

The controller 23 centrally controls the entire semiconductor storage device 1. The controller 23 is a semiconductor package that includes a system on a chip (SoC) in which, for example, a host interface circuit that performs communication with the host device, a control circuit that controls a plurality of DRAMs 24, and a control circuit that controls a plurality of semiconductor memories 25 are integrated on one semiconductor chip.

In the at least one embodiment, the controller 23 is mounted on the second surface S2 of the substrate 21. A heat conduction member 51 (for example, a heat conduction sheet) is provided between the controller 23 and the second main wall 12 of the housing 10 (see FIG. 6). The controller 23 is connected to the second main wall 12 of the housing 10 via the heat conduction member 51. A part of the heat, which is generated from the controller 23, is transmitted to the second main wall 12 of the housing 10 via the heat conduction member 51 and emitted to the outside of the housing 10 from the second main wall 12.

The DRAM 24 is a semiconductor package that includes semiconductor memory chips storing data in a volatile manner. The DRAM 24 is used as a data buffer that temporarily stores write data, which is received from the host device, read data, which is read from the semiconductor memory 25, or the like. In the present embodiment, the DRAM 24 is mounted on the first surface S1 of the substrate 21. A heat dissipation structure related to the DRAM 24 will be described later.

The semiconductor memory 25 is a semiconductor package that includes semiconductor memory chips storing data in a nonvolatile manner. The semiconductor memory 25 is, for example, a NAND flash memory. The semiconductor memory 25 is an example of a "semiconductor component". However, the "semiconductor component" and the "semiconductor memory" are not limited to the above examples, and may be other types of memory such as a NOR type memory, a magnetoresistive random access memory (MRAM), and a resistance change type memory. Further, the "semiconductor component" is not limited to a semiconductor memory, and may be a power supply circuit component such as a power management IC (PMIC), an electric power conversion component such as a DC-DC converter, or a semiconductor component having other functions.

In at least one embodiment, the plurality of semiconductor memories 25 are separately mounted on the first surface S1 and the second surface S2 of the substrate 21. The plurality of semiconductor memories 25 include a plurality of semiconductor memories 25A mounted on the first surface S1 of the substrate 21 and a plurality of semiconductor memories 25B mounted on the second surface S2 of the substrate 21. In the following, the "semiconductor memory 25A" and the "semiconductor memory 25B" are simply referred to as the "semiconductor memory 25" when not distinguished from each other.

In at least one embodiment, the plurality of semiconductor memories 25A mounted on the first surface S1 include three semiconductor memories 25A1, 25A2, and 25A3 arranged side by side along the first end portion 21*a* of the substrate 21. The three semiconductor memories 25A1, 25A2, and 25A3 are arranged in the order of the semiconductor memory 25A1, the semiconductor memory 25A2, and the semiconductor memory 25A3 in the −Y direction.

Figure 6:
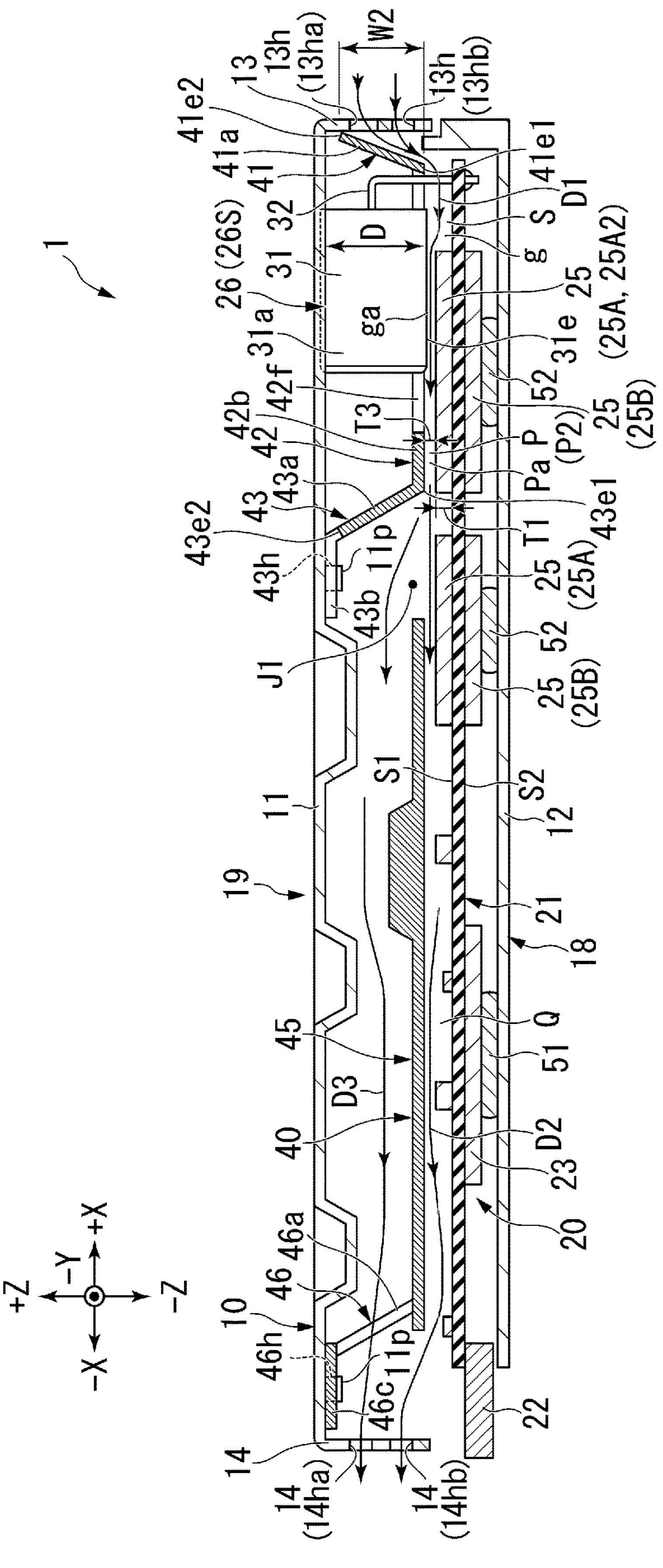
FIG. 6 is a cross-sectional view taken along the line F6-F6 of the semiconductor storage device shown in FIG. 1.

In at least one embodiment, a heat conduction member 52 (for example, a heat conduction sheet) is provided between the semiconductor memory 25B mounted on the second surface S2 and the second main wall 12 of the housing 10 (see FIG. 6). The semiconductor memory 25B is connected to the second main wall 12 of the housing 10 via the heat conduction member 52. A part of the heat, which is generated from the semiconductor memory 25B, is transmitted to the second main wall 12 of the housing 10 via the heat conduction member 52 and emitted to the outside of the housing 10 from the second main wall 12. A heat dissipation structure related to the semiconductor memory 25A mounted on the first surface S1 will be described later.

The capacitor 26 has a power supply backup function for the purpose of data protection in the event of unexpected electric power interruption. For example, the capacitor 26 supplies electric power to the controller 23, the plurality of DRAMs 24, and the plurality of semiconductor memories 25 for a certain period of time when the electric power supply from the host device is unexpectedly interrupted. The capacitor 26 is, for example, an electrolytic capacitor. Furthermore, the capacitor 26 is, for example, an aluminum electrolytic capacitor. However, the capacitor 26 is not limited to the above example. The capacitor 26 is an example of an "electronic component."

The capacitor 26 is mounted on the substrate 21. In at least one embodiment, the plurality of capacitors 26 include a plurality of (for example, three) capacitors 26S and a plurality of (for example, three) capacitors 26T. The plurality of capacitors 26S are arranged side by side along the first end portion 21*a* of the substrate 21. That is, the plurality of capacitors 26S are arranged side by side in the Y direction. Meanwhile, the plurality of capacitors 26T are arranged side by side along the third end portion 21*c* of the substrate 21. That is, the plurality of capacitors 26T are arranged side by side in the X direction. In the following, the "capacitor 26S" and the "capacitor 26T" are simply referred to as the "capacitor 26" when not distinguished from each other.

4. Mounting Structure of Capacitor

Next, the mounting structure of the capacitor 26 will be described. The capacitor 26 includes, for example, a component main body 31 and two leads 32.

The component main body 31 is a portion that performs the main function of the capacitor 26. For example, the component main body 31 is a portion that stores charges when a DC voltage is applied. The component main body 31 includes, for example, a metal that serves as an electrode, a dielectric, and an electrolytic solution. The component main body 31 has, for example, a cylindrical shape. The capacitor 26S is disposed with the central axis C of the component main body 31 along the X direction. Meanwhile, the capacitor 26T is disposed with the central axis C of the component main body 31 along the Y direction.

In at least one embodiment, when viewed from the Z direction, the component main body 31 includes a portion 31*a* overlapping the semiconductor memory 25A from a side opposite to the substrate 21 (hereinafter, referred to as an "overlapping portion 31*a*"). Since the component main body 31 and the semiconductor memory 25A are disposed in an overlapping manner, the required mounting area of the substrate 21 can be reduced. As described above, "overlapping" in the present application may include cases where parts overlap with each other. That is, "the component main body 31 overlaps the semiconductor memory 25A" is not limited to the case where the entire component main body 31 overlaps the semiconductor memory 25A, and may include the case where a part of the component main body 31 overlaps the semiconductor memory 25A.

In the at least one embodiment, a gap S is formed between the capacitor 26 and the substrate 21. The gap S includes a gap g that is formed between the component main body 31 of the capacitor 26 and the substrate 21. The gap g includes a gap ga that is formed between the component main body 31 of the capacitor 26 and the semiconductor memory 25A mounted on the substrate 21. For example, a thickness T2 of the gap ga in the Z direction is smaller than a thickness (a mounting height) T1 of the semiconductor memory 25A in the Z direction. The gap S is an example of a "first gap". The gap g is an example of a "second gap". The gap ga is an example of a "third gap".

The lead 32 is a terminal for electrical connection. The lead 32 protrudes from the component main body 31 in the X direction or the Y direction, is bent in the −Z direction, and is connected to the substrate 21. For example, the lead 32 of the capacitor 26S protrudes from the component main body 31 in the X direction and is connected to the substrate 21 at a location on the +X direction side of the semiconductor memory 25 on which the component main body 31 of the capacitor 26S overlaps. The lead 32 of the capacitor 26T is pulled out from the component main body 31 in the Y direction and is connected to the substrate 21 at a location on the +Y direction side of the semiconductor memory 25 on which the component main body 31 of the capacitor 26T overlaps.

5. Inner Plate

Next, the inner plate 40 will be described.

Figure 4:
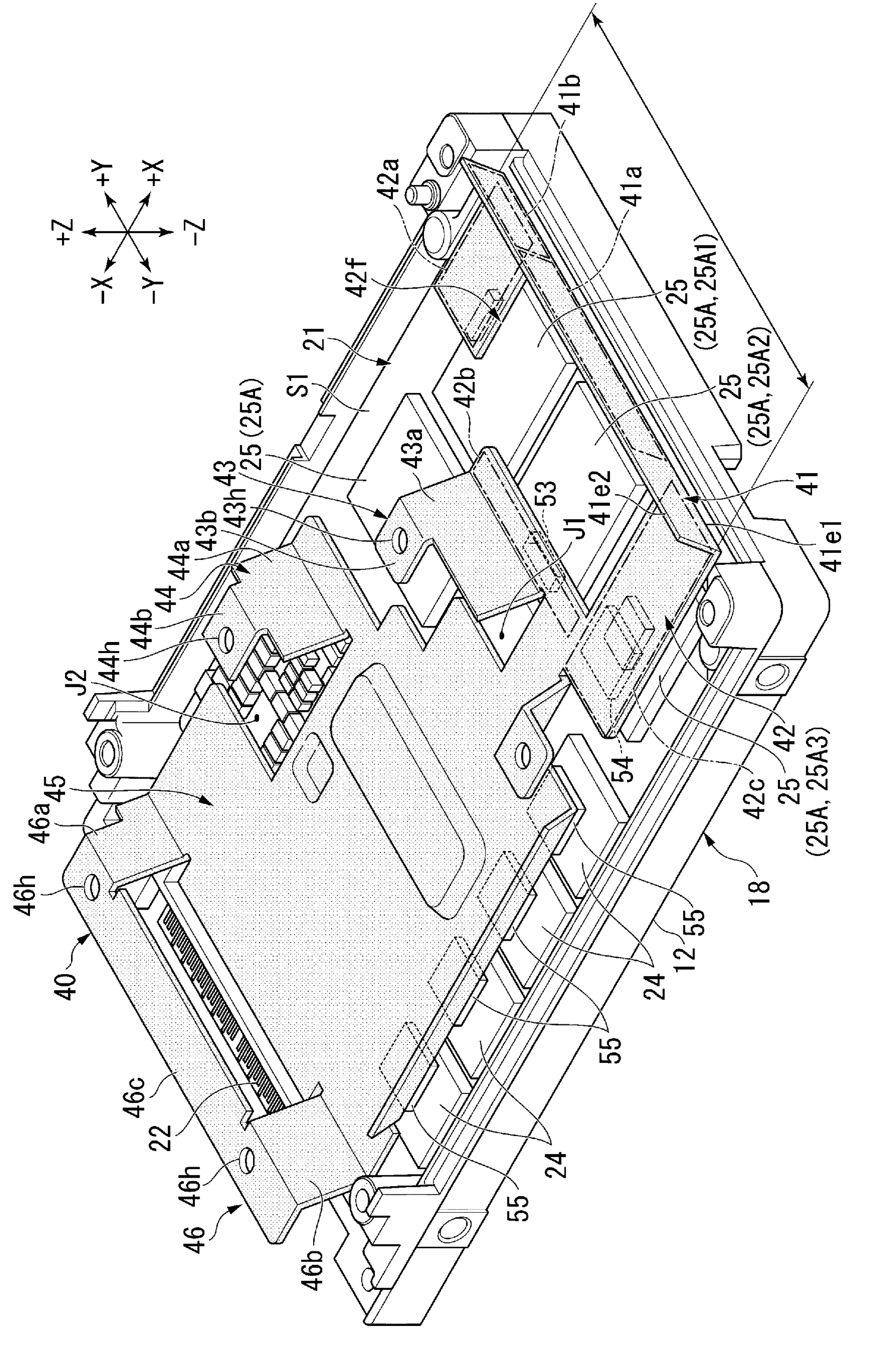
FIG. 4 is a perspective view illustrating an inner plate of a first embodiment.

FIG. 4 is a perspective view illustrating the inner plate 40. FIG. 4 is a view of the structure shown in FIG. 2 with capacitor 26 removed. The inner plate 40 includes, for example, a heat conduction function of transmitting heat, which is generated within the housing 10, to the first main wall 11 of the housing 10 and a regulation function of guiding air that flows inside the housing 10. The inner plate 40 may include only the regulation function without including the heat conduction function.

Here, the function of each configuration when air (cooling air) flows in the housing 10 in the −X direction will be described. The function of each configuration when air (cooling air) flows in the housing 10 in the +X direction will be described later. The inner plate 40 includes, for example, a first regulation portion 41, a first cover portion 42, a second regulation portion 43, a third regulation portion 44, a second cover portion 45, and a mounting portion 46. The inner plate 40 is made of metal, for example.

First Regulation Portion

The first regulation portion 41 is a regulation portion that changes the flow direction of the air in the housing 10. In at least one embodiment, the first regulation portion 41 guides at least a part of the air, which flows inside the housing 10, toward the gap S (see FIG. 6) between the capacitor 26 and the substrate 21. For example, the first regulation portion 41 guides at least a part of the air, which flows inside the housing 10, toward the gap g (see FIG. 6) between the component main body 31 of the capacitor 26 and the substrate 21. In the present application, "guiding air toward a gap" is not limited to guiding air directly to the gap, and may include the case where the air, which is guided to an upstream area of the gap, flows into the gap in a natural flow thereafter by guiding the air to the upstream area of the gap. In at least one embodiment, the first regulation portion 41 is formed in a plate shape as a part of the inner plate 40. The first regulation portion 41 is an example of each of a "first regulating plate" and a "first inclined plate". The first regulation portion 41 may be referred to as a "first regulating plate portion" or a "first inclined plate portion".

In at least one embodiment, the first regulation portion 41 is provided at an end portion of the inner plate 40 on the +X direction side. At least a part (for example, all) of the first regulation portion 41 is inclined with respect to the Z direction. The first regulation portion 41 is inclined with respect to the Z direction and the X direction so as to be located on the +X direction side as the first regulation portion 41 progresses toward the +Z direction side. In other words, the first regulation portion 41 is inclined with respect to the Z direction and the X direction so as to approach the ventilation hole 13*h* as the first regulation portion 41 is separated from the substrate 21. In at least one embodiment, the first regulation portion 41 is inclined with respect to the Z direction at any angle between 30° and 60°.

The first regulation portion 41 is provided, for example, over the entire width of the inner plate 40 in the Y direction. For example, a width W1 (see FIG. 4) of the first regulation portion 41 in the Y direction is larger than the maximum distance L1 (see FIG. 1) between an inner surface of the ventilation hole 13*h* located on the most +Y direction side and an inner surface of the ventilation hole 13*h* located on the most −Y direction side, on the first side wall 13 of the housing 10.

Figure 5:
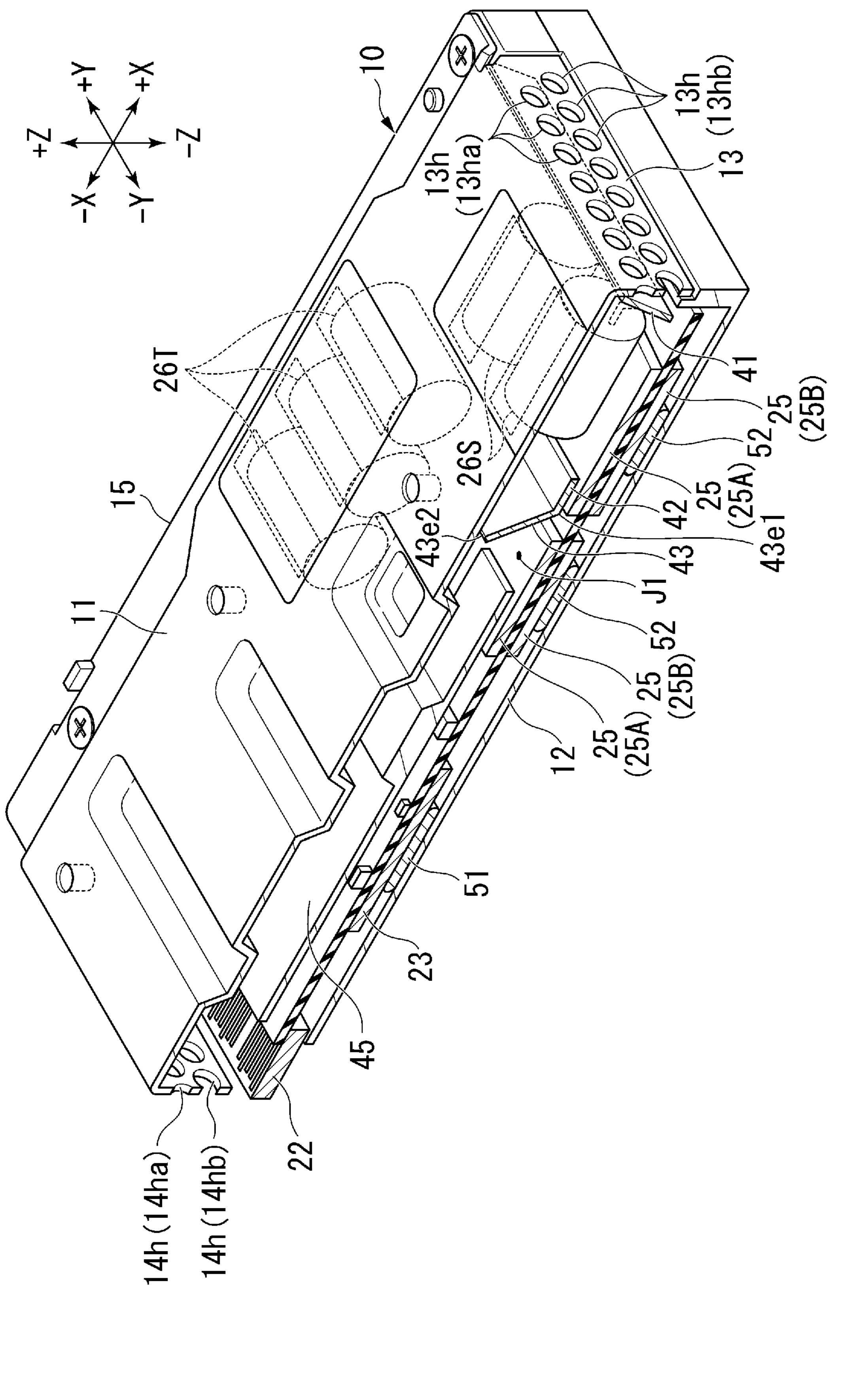
FIG. 5 is a perspective cross-sectional view taken along the line F5-F5 of the semiconductor storage device shown in FIG. 1.

FIG. 5 is a perspective cross-sectional view taken along the line F5-F5 of the semiconductor storage device 1 shown in FIG. 1. As shown in FIG. 5, the first regulation portion 41 is disposed between the plurality of capacitors 26 and the plurality of ventilation holes 13*h* of the first side wall 13 of the housing 10 in the X direction. The first regulation portion 41 overlaps the plurality of ventilation holes 13*h* of the first side wall 13 of the housing 10 when viewed from the X direction. In at least one embodiment, the first regulation portion 41 overlaps all the ventilation holes 13*h* provided on the first side wall 13 of the housing 10 when viewed from the X direction.

FIG. 6 is a cross-sectional view taken along the line F6-F6 of the semiconductor storage device 1 shown in FIG. 1. The first regulation portion 41 extends from a location above the upper ends of the ventilation holes 13*ha* arranged in the first row R1 to a location below the lower ends of the ventilation holes 13*hb* arranged in the second row R2. From another point of view, the dimension W2 of the first regulation portion 41 in the Z direction is a half or more of the diameter D of the component main body 31 of the capacitor 26. In at least one embodiment, a lower end 41*e*1 of the first regulation portion 41 is located at the same height as a lower end 31*e* of the component main body 31 of the capacitor 26 in the Z direction.

In at least one embodiment, the air, which flows in the housing 10 from the ventilation hole 13*h* of the first side wall 13 of the housing 10, collides with the first regulation portion 41 in a space between the first side wall 13 of the housing 10 and the capacitor 26. The flow direction of the air, which has flowed in, is changed along the first regulation portion 41. As a result, the air, which has flowed in, flows obliquely downward. As a result, the first regulation portion 41 guides at least a part of the air, which flows inside the housing 10, toward the gap g between the component main body 31 of the capacitor 26 and the substrate 21.

In at least one embodiment, the gap g between the component main body 31 of the capacitor 26 and the substrate 21 includes the gap ga between the component main body 31 of the capacitor 26 and the semiconductor memory 25A. The first regulation portion 41 guides at least a part of the air, which flows inside the housing 10, toward the gap g between the component main body 31 of the capacitor 26 and the substrate 21. Therefore, the first regulation portion 41 guides at least a part of the air, which flows inside the housing 10, toward the gap ga between the component main body 31 of the capacitor 26 and the semiconductor memory 25A. For example, the first regulation portion 41 guides at least a part of the air, which flows inside the housing 10, toward the gap g between the component main body 31 of the capacitor 26 and the substrate 21 at a location on an upstream side of the gap ga between the component main body 31 of the capacitor 26 and the semiconductor memory 25A. Therefore, the first regulation portion 41 guides at least a part of the air, which flows inside the housing 10, toward the gap ga between the component main body 31 of the capacitor 26 and the semiconductor memory 25A.

As shown in FIG. 6, a part of the first regulation portion 41 (hereinafter, referred to as a "first portion 41*a*") is disposed between the plurality of capacitors 26S and the plurality of ventilation holes 13*h* of the first side wall 13 of the housing 10 in the X direction. The first portion 41*a* of the first regulation portion 41 guides a part of the air, which flows inside the housing 10, toward the gap g between the component main body 31 of the capacitor 26S and the substrate 21. Therefore, the first regulation portion 41 guides a part of the air, which flows inside the housing 10, toward the gap ga between the component main body 31 of the capacitor 26S and the semiconductor memory 25A.

Figure 7:
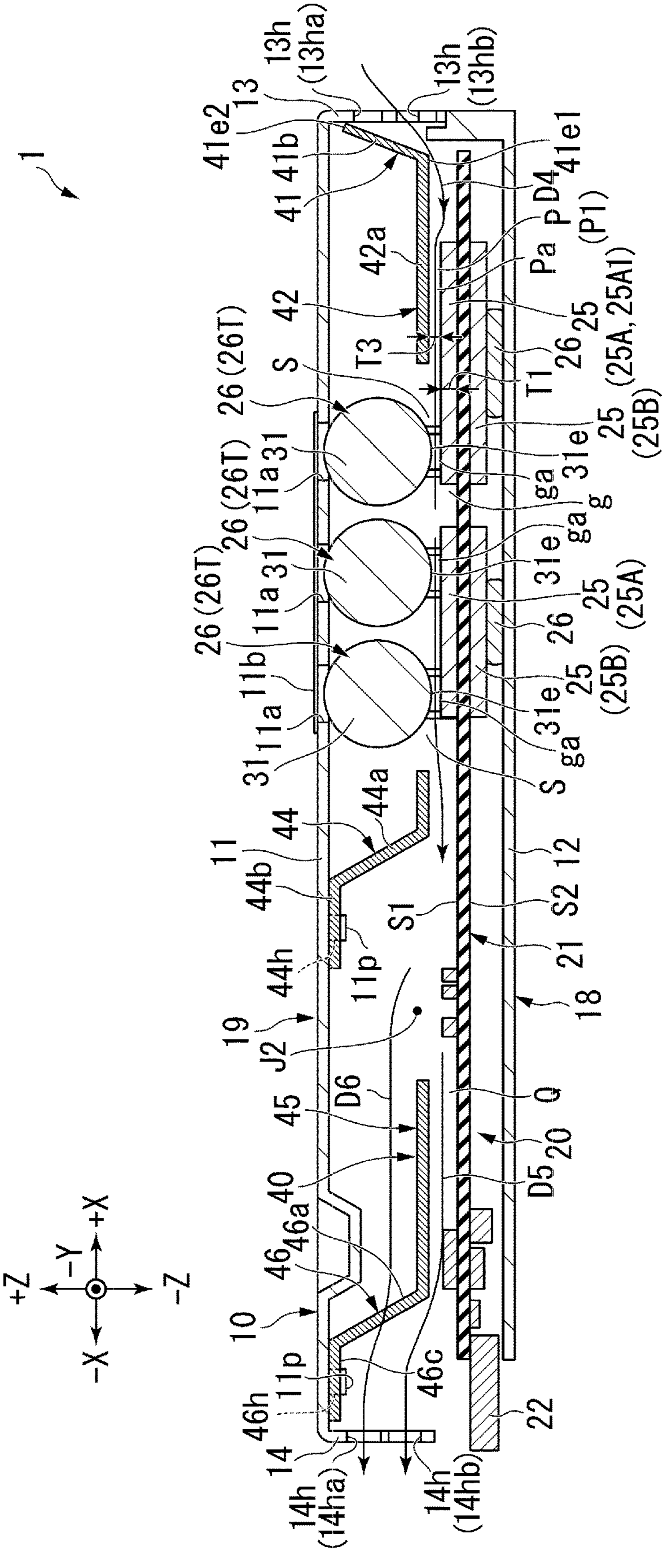
FIG. 7 is a cross-sectional view taken along the line F7-F7 of the semiconductor storage device shown in FIG. 1.

FIG. 7 is a cross-sectional view taken along the line F7-F7 of the semiconductor storage device 1 shown in FIG. 1. In at least one embodiment, another part of the first regulation portion 41 (hereinafter, referred to as a "second portion 41*b*") is disposed between the plurality of capacitors 26T and the plurality of ventilation holes 13*h* of the first side wall 13 of the housing 10 in the X direction. The second portion 41*b* of the first regulation portion 41 guides a part of the air, which flows inside the housing 10, toward the gap g between the component main body 31 of the capacitor 26T and the substrate 21. Therefore, the first regulation portion 41 guides a part of the air, which flows inside the housing 10, toward the gap ga between the component main body 31 of the capacitor 26T and the semiconductor memory 25A.

First Cover Portion

Returning to FIG. 4, the first cover portion 42 will be described. The first cover portion 42 is a flow path forming portion that forms a flow path of the air in the vicinity of the substrate 21 in the housing 10. In at least one embodiment, the first cover portion 42 guides at least a part of the air, which is guided toward the substrate 21 by the first regulation portion 41, along the vicinity of the substrate 21 (for example, along a surface of the semiconductor memory 25A) in the −X direction. In at least one embodiment, the first cover portion 42 is formed in a plate shape as a part of the inner plate 40. The first cover portion 42 is an example of a "first cover plate". The first cover portion 42 may be referred to as a "first cover plate portion".

In at least one embodiment, the first cover portion 42 overlaps the substrate 21 when viewed from the Z direction. The first cover portion 42 is a plate portion along the X direction and the Y direction. The first cover portion 42 is provided continuously with the first regulation portion 41 on the −X direction side of the first regulation portion 41. For example, the first cover portion 42 extends from at least a part of the lower end 41*e*1 of the first regulation portion 41 (see FIGS. 6 and 7) in the −X direction. Here, the first regulation portion 41 includes, for example, the lower end 41*e*1 and an upper end 41*e*2 as a plurality of ends. The lower end 41*e*1 of the first regulation portion 41 is an end closest to the substrate 21 among the plurality of ends of the first regulation portion 41. The lower end 41*e*1 of the first regulation portion 41 is an example of a "first end". A flow path P, through which at least a part of the air that is guided toward the substrate 21 by the first regulation portion 41 flows, is formed between the first cover portion 42 and the substrate 21 (see FIGS. 6 and 7).

In at least one embodiment, the first cover portion 42 overlaps the semiconductor memory 25A from the side opposite to the substrate 21 when viewed in the Z direction. As a result, a flow path Pa, through which at least a part of the air that is guided toward the substrate 21 by the first regulation portion 41 flows, is formed between the first cover portion 42 and the semiconductor memory 25A (see FIGS. 6 and 7). For example, a thickness T3 of the flow path Pa in the Z direction is smaller than a thickness (a mounting height) T1 of the semiconductor memory 25 in the Z direction (see FIGS. 6 and 7).

As shown in FIG. 4, the first cover portion 42 is provided at least a part around the capacitor 26 (for example, the capacitor 26S) while avoiding an area overlapping the capacitor 26 (for example, the capacitor 26S) when viewed in the Z direction. In at least one embodiment, the first cover portion 42 includes a cut-out portion 42*f* that is larger than the plurality of capacitors 26S when viewed in the Z direction. The cut-out portion 42*f* is an opening or a notch provided in the first cover portion 42 to avoid contact between the first cover portion 42 and the capacitor 26S. The plurality of capacitors 26S are disposed in the cut-out portion 42*f*, so that the first cover portion 42 is provided at least a part around the plurality of capacitors 26S. In at least one embodiment, a disposition height (that is, a height location in the Z direction) of the first cover portion 42 with respect to the substrate 21 is the same as a part of the capacitor 26. In other words, the first cover portion 42 is adjacent to a part of the capacitor 26 in a direction parallel to the substrate 21 (that is, the X direction or the Y direction).

In at least one embodiment, the first cover portion 42 includes a first portion 42*a*, a second portion 42*b*, and a third portion 42*c*.

The first portion 42*a* is located on the +Y direction side with respect to the plurality of capacitors 26S. The first portion 42*a* extends from the lower end 41*e*1 of the second portion 41*b* of the first regulation portion 41 in the −X direction. A flow path P1, which guides at least a part of the air that is guided toward the substrate 21 by the first regulation portion 41 toward the gap ga between the capacitor 26T and the semiconductor memory 25A, is formed between the first portion 42*a* and the substrate 21 (see FIG. 7). The flow path P1 is an example of the flow path P.

The second portion 42*b* is located on the −X direction side with respect to the plurality of capacitors 26S. The second portion 42*b* extends from a lower end 43*e*1 (see FIGS. 5 and 6) of the second regulation portion 43, which will be described later, in the +X direction. A flow path P2, which guides at least a part of the air that has been guided toward the substrate 21 by the first regulation portion 41 and that has passed through the gap ga between the capacitor 26S and the semiconductor memory 25A to a downstream side along the vicinity of the substrate 21, is formed between the second portion 42*b* and the substrate 21 (see FIG. 6). The flow path P2 is an example of the flow path P.

As shown in FIG. 4, the second portion 42*b* overlaps the semiconductor memory 25A2 from the side opposite to the substrate 21 when viewed in the Z direction. In at least one embodiment, a heat conduction member 53 (for example, a heat conduction sheet) is disposed between the semiconductor memory 25A2 and the second portion 42*b* of the first cover portion 42. The semiconductor memory 25A2 is connected to the second portion 42*b* of the first cover portion 42 via the heat conduction member 53. In at least one embodiment, the inner plate 40 is connected to the first main wall 11 of the housing 10 as shown in a fixing structure, which will be described later. Therefore, the semiconductor memory 25A2 is connected to the first main wall 11 of the housing 10 via the heat conduction member 53 and the inner plate 40. A part of the heat, which is generated from the semiconductor memory 25A2, is transmitted to the first main wall 11 of the housing 10 via the heat conduction member 53 and the inner plate 40, and is emitted to the outside of the housing 10 from the first main wall 11. The semiconductor memory 25A2 is an example of a "first semiconductor component". The heat conduction member 53 is an example of a "first heat conduction member". The "first semiconductor component" is not limited to the semiconductor memory 25A2, and may be a semiconductor memory 25A1, a semiconductor memory 25A3, or a semiconductor memory 25A disposed below the capacitor 26T.

The third portion 42*c* is located on the −Y direction side with respect to the plurality of capacitors 26S. The third portion 42*c* is a connection portion that connects the first regulation portion 41 and other portions of the inner plate 40. The third portion 42*c* overlaps the semiconductor memory 25A3 from the side opposite to the substrate 21 when viewed in the Z direction.

In at least one embodiment, a heat conduction member 54 (for example, a heat conduction sheet) is disposed between the semiconductor memory 25A3 and the third portion 42*c* of the first cover portion 42. The semiconductor memory 25A3 is connected to the third portion 42*c* of the first cover portion 42 via the heat conduction member 54. The semiconductor memory 25A3 is connected to the first main wall 11 of the housing 10 via the heat conduction member 54 and the inner plate 40. A part of the heat, which is generated from the semiconductor memory 25A3, is transmitted to the first main wall 11 of the housing 10 via the heat conduction member 54 and the inner plate 40, and is emitted to the outside of the housing 10 from the first main wall 11. The semiconductor memory 25A3 is an example of a "second semiconductor component". The heat conduction member 54 is an example of a "second heat conduction member".

Second Regulation Portion

The second regulation portion 43 is a regulation portion that changes the flow direction of the air in the housing 10. In at least one embodiment, the second regulation portion 43 releases a part (for example, a part of the air that has flowed through the gap ga between the capacitor 26 and the semiconductor memory 25A) of the air, which has flowed through the gap g between the component main body 31 of the capacitor 26 and the substrate 21 in the −X direction, above the inner plate 40. This content will be described later in detail. In the present embodiment, the second regulation portion 43 is formed in a plate shape as a part of the inner plate 40. The second regulation portion 43 is an example of each of a "second regulating plate" and a "second inclined plate". The second regulation portion 43 may also be referred to as a "second regulating plate portion" or a "second inclined plate portion".

In at least one embodiment, the second regulation portion 43 is located on the side opposite to the first regulation portion 41 with respect to the capacitor 26S in the X direction. For example, the second regulation portion 43 is located on the side opposite to the first portion 41*a* of the first regulation portion 41 with respect to the capacitor 26S in the X direction. The second regulation portion 43 includes an inclined portion 43*a* and a fixed portion 43*b*.

The inclined portion 43*a* is inclined on the side opposite to the first regulation portion 41 with respect to the Z direction. The inclined portion 43*a* is inclined with respect to the Z direction and the X direction so as to be located on the −X direction side as the inclined portion 43*a* progresses toward the +Z direction side. In at least one embodiment, the inclined portion 43*a* is inclined with respect to the Z direction at any angle between 30° and 60°. The second portion 42*b* of the first cover portion 42 described above extends from at least a part of the lower end 43*e*1 of the second regulation portion 43 in the −X direction. Here, the second regulation portion 43 includes, for example, the lower end 43*e*1 and an upper end 43*e*2 as a plurality of ends. The lower end 43*e*1 of the second regulation portion 43 is a lower end of the inclined portion 43*a* and is an end closest to the substrate 21 in the second regulation portion 43. The lower end 43*e*1 of the second regulation portion 43 is an example of a "second end". In at least one embodiment, the first cover portion 42 connects at least a part of the lower end 41*e*1 of the first regulation portion 41 and at least a part of the lower end 43*e*1 of the second regulation portion 43.

The fixed portion 43*b* extends from the upper end of the inclined portion 43*a* in the −X direction. The fixed portion 43*b* includes, for example, a through hole 43*h*. The through hole 43*h* penetrates the fixed portion 43*b* in the Z direction. The protrusion 11*p* of the first main wall 11 of the housing 10 is inserted into the through hole 43*h* and is fixed by caulking. As a result, the fixed portion 43*b* and the housing 10 are connected to each other.

Third Regulation Portion

The third regulation portion 44 is a regulation portion that changes the flow direction of the air in the housing 10. In at least one embodiment, the third regulation portion 44 releases a part (for example, a part of the air that has flowed through the gap ga between the capacitor 26 and the semiconductor memory 25A) of the air, which has flowed through the gap g between the component main body 31 of the capacitor 26 and the substrate 21 in the −X direction, above the inner plate 40. This content will be described later in detail. In at least one embodiment, the third regulation portion 44 is formed in a plate shape as a part of the inner plate 40. The third regulation portion 44 is an example of each of the "second regulating plate" and the "second inclined plate", and an example of each of a "third regulating plate" and a "third inclined plate". The third regulation portion 44 may also be referred to as a "third regulating plate portion" or a "third inclined plate portion".

In at least one embodiment, the third regulation portion 44 is located on the side opposite to the first regulation portion 41 with respect to the capacitor 26T in the X direction. For example, the third regulation portion 44 is located on the side opposite to the second portion 41*b* of the first regulation portion 41 with respect to the capacitor 26T in the X direction. The third regulation portion 44 includes an inclined portion 44*a* and a fixed portion 44*b*.

The inclined portion 44*a* is inclined on the side opposite to the first regulation portion 41 with respect to the Z direction. The inclined portion 44*a* is inclined with respect to the Z direction and the X direction so as to be located on the −X direction side as the inclined portion 44*a* progresses toward the +Z direction side. In at least one embodiment, the inclined portion 44*a* is inclined with respect to the Z direction at any angle between 30° and 60°.

The fixed portion 44*b* extends from the upper end of the inclined portion 44*a* in the −X direction. The fixed portion 44*b* includes, for example, a through hole 44*h*. The through hole 44*h* penetrates the fixed portion 44*b* in the Z direction. The protrusion 11*p* of the first main wall 11 of the housing 10 is inserted into the through hole 44*h* and is fixed by caulking. As a result, the fixed portion 44*b* and the housing 10 are connected to each other.

Second Cover Portion

The second cover portion 45 is a flow path forming portion that forms a flow path of the air in the vicinity of the substrate 21 in the housing 10. In at least one embodiment, the second cover portion 45 guides at least a part of the air, which is guided toward the substrate 21 by the first regulation portion 41, along the vicinity of the substrate 21 in the −X direction. In at least one embodiment, the second cover portion 45 is formed in a plate shape as a part of the inner plate 40. The second cover portion 45 is an example of a "second cover plate". The second cover portion 45 may be referred to as a "second cover plate portion".

In at least one embodiment, the second cover portion 45 overlaps the substrate 21 when viewed from the Z direction. The second cover portion 45 is a plate portion along the X direction and the Y direction. The second cover portion 45 is disposed on the side opposite to the capacitor 26 with respect to the second regulation portion 43 and the third regulation portion 44 in the X direction. A flow path Q through which air flows is formed between the second cover portion 45 and the substrate 21 (see FIGS. 6 and 7).

As shown in FIG. 4, the second cover portion 45 overlaps the plurality of DRAMs 24 from the side opposite to the substrate 21 when viewed in the Z direction. The heat conduction member 55 (for example, a heat conduction sheet) is provided between the DRAM 24 and the inner plate 40 (see FIG. 4). The DRAM 24 is connected to the first main wall 11 of the housing 10 via the heat conduction member 55 and the inner plate 40. A part of the heat, which is generated from the DRAM 24, is transmitted to the first main wall 11 of the housing 10 via the heat conduction member 55 and the inner plate 40, and is emitted to the outside of the housing 10 from the first main wall 11. The DRAM 24 is an example of each of a "third semiconductor component" and a "fourth semiconductor component". The heat conduction member 55 is an example of each of a "third heat conduction member" and a "fourth heat conduction member".

As shown in FIG. 4, the second cover portion 45 is disposed with a space J1, where a part of the air in the housing 10 is movable in the Z direction, between at least a part of the second cover portion 45 and the second regulation portion 43. As a result, a part of the air that has passed through the gap g between the capacitor 26S and the substrate 21 and/or a part of the air that has passed through the flow path P between the first cover portion 42 and the substrate 21 is movable above (+Z direction side) the second cover portion 45 through the space J1. In the present application, "air is movable in the Z direction" is not limited to the case where the air is movable in a direction aligned to the Z direction (for example, movable right up), and may include a case where the air is movable in a direction inclined with respect to the Z direction (for example, movable in an obliquely upward direction).

Similarly, the second cover portion 45 is disposed with a space J2, where a part of the air in the housing 10 is movable in the Z direction, between at least a part of the second cover portion 45 and the third regulation portion 44. As a result, a part of the air that has passed through the gap g between the capacitor 26T and the substrate 21 is movable above (+Z direction side) the second cover portion 45 through the space J2.

The mounting portion 46 is a portion for fixing the inner plate 40 to the housing 10. The mounting portion 36 is provided, for example, at an end portion of the inner plate 40 on the −X direction side. The mounting portion 46 includes, for example, a pair of inclined portions 46*a* and 46*b* and a fixed portion 46*c*.

The inclined portions 46*a* and 46*b* are provided continuously with the end portion of the second cover portion 45. The inclined portions 46*a* and 46*b* are inclined with respect to the Z direction so as to be located in the −X direction as the inclined portions 46*a* and 46*b* progresses in the +Z direction. The pair of inclined portions 46*a* and 46*b* are spaced apart from each other in the Y direction.

The fixed portion 46*c* extends in the −X direction from upper ends of the inclined portions 46*a* and 46*b*. The fixed portion 46*c* includes, for example, a through hole 46*h*. The through hole 46*h* penetrates the fixed portion 46*c* in the Z direction. The protrusion 11*p* of the first main wall 11 of the housing 10 is inserted into the through hole 46*h* and is fixed by caulking. As a result, the fixed portion 46*c* and the housing 10 are connected to each other.

6. Operation

Next, operation of the semiconductor storage device 1 (operation in a first environment) will be described.

First, the flow of the air related to the capacitor 26S will be described with reference to FIG. 6. As shown in FIG. 6, the cooling air flows into the housing 10 from the outside of the housing 10 through the ventilation hole 13*h* of the first side wall 13 of the housing 10. At least a part of the air that has flowed into the housing 10 collides with the first regulation portion 41. The flow direction of the air, which has flowed in, is changed along the first regulation portion 41. As a result, the air, which has flowed in, flows along the first regulation portion 41. The air that flows along the first regulation portion 41 is supplied to the gap g between the component main body 31 of the capacitor 26S and the substrate 21 (see an arrow D1). As a result, a flow rate of the air flowing below the component main body 31 of the capacitor 26S is increased. Therefore, cooling of the semiconductor memory 25A, which is located below the component main body 31 of the capacitor 26S, is improved. For example, a part of the air supplied to the gap g between the component main body 31 of the capacitor 26S and the substrate 21 flows through the gap ga between the component main body 31 of the capacitor 26S and the semiconductor memory 25A. Thereby, the cooling of the semiconductor memory 25A is improved.

A part of the air, which has flowed through the gap g between the component main body 31 of the capacitor 26S and the substrate 21, flows through the flow path P between the first cover portion 42 and the substrate 21 and reaches the second regulation portion 43. A part of the air, which has reached the second regulation portion 43, maintains the flow in the vicinity of the substrate 21 and flows through the flow path Q between the second cover portion 45 and the substrate 21 (see an arrow D2). As a result, the cooling of the second cover portion 45 is improved and the cooling of the components mounted on the first surface S1 of the substrate 21 is also improved.

In at least one embodiment, at least a part of the second regulation portion 43 (for example, the inclined portion 43*a*) is inclined with respect to the X direction. As described later with reference to FIG. 8, at least a part of the second regulation portion 43 is inclined for supplying at least a part of the air, which flows inside the housing 10, to the gap g between the component main body 31 of the capacitor 26S and the substrate 21 when the air flows in the opposite direction inside the housing 10 (a second environment described later). Further, instead of/in addition to the above reasons, at least a part of the second regulation portion 43 is inclined, for disposing the fixed portion 43*b*, which fixes the inner plate 40 to the housing 10, near the first main wall 11 of the housing 10.

When the second regulation portion 43 is inclined, the following operation can be expected. That is, as shown in FIG. 6, another part of the air, which has flowed from the flow path P between the first cover portion 42 and the substrate 21 through the gap g between the capacitor 26S and the substrate 21 and which has reached the second regulation portion 43, moves above the second cover portion 45 through the space J1. The air that has moved above the second cover portion 45 flows along an upper surface of the second cover portion 45 (see an arrow D3). As a result, the cooling of the second cover portion 45 is improved. That is, in at least one embodiment, the flow of the air is divided into two on a downstream side of the second regulation portion 43, and the second cover portion 45 is cooled from above and below. As a result, heat dissipation of the second cover portion 45 is efficiently performed. Here, when at least a part of the second regulation portion 43 is inclined, pressure loss is less likely to occur in the flow of the air moving above the second cover portion 45 through the space J1. Therefore, good flow of the air is easily formed above and below the second cover portion 45. Thereby, the cooling of the inner plate 40 is further improved.

The air that has passed through the second cover portion 45 is discharged from the ventilation hole 14*h* of the second side wall 14 of the housing 10 to the outside of the housing 10.

Next, the flow of the air related to the capacitor 26T will be described with reference to FIG. 7. As shown in FIG. 7, the cooling air flows into the housing 10 from the outside of the housing 10 through the ventilation hole 13*h* of the first side wall 13 of the housing 10. The flow direction of at least a part of the air that has flowed into the housing 10 is changed to flow along the first regulation portion 41 by colliding with the first regulation portion 41. The air, which flows along the first regulation portion 41, is guided by the first portion 42*a* of the first cover portion 42 and supplied to the gap g between the component main body 31 of the capacitor 26T and the substrate 21 (see an arrow D4). As a result, a flow rate of the air flowing below the component main body 31 of the capacitor 26T is increased. As a result, cooling of the semiconductor memory 25A, which is located below the component main body 31 of the capacitor 26T, is improved. For example, a part of the air supplied to the gap g between the component main body 31 of the capacitor 26T and the substrate 21 flows through the gap ga between the component main body 31 of the capacitor 26T and the semiconductor memory 25A. Thereby, the cooling of the semiconductor memory 25A is further improved.

A part of the air that has flowed through the gap g between the component main body 31 of the capacitor 26T and the substrate 21 reaches the third regulation portion 44. A part of the air, which has reached the third regulation portion 44, continues to flow in the vicinity of the substrate 21 and flows through the flow path Q between the second cover portion 45 and the substrate 21 (see an arrow D5). As a result, the cooling of the second cover portion 45 is improved and the cooling of the components mounted on the substrate 21 is also improved.

In at least one embodiment, at least a part of the third regulation portion 44 (for example, the inclined portion 44*a*) is inclined with respect to the X direction. As described later with reference to FIG. 9, at least a part of the third regulation portion 44 is inclined for supplying at least a part of the air, which flows inside the housing 10, to the gap g between the component main body 31 of the capacitor 26T and the substrate 21 when the air flows in the opposite direction inside the housing 10 (the second environment described later). Further, instead of/in addition to, and/or, the above reasons, at least a part of the third regulation portion 44 is inclined, the fixed portion 44*b*, which fixes the inner plate 40 to the housing 10, near the first main wall 11 of the housing 10.

When the third regulation portion 44 is inclined, the following operation can be expected. That is, as shown in FIG. 7, a part of the air, which has flowed from the flow path P (between the first cover portion 42 and the substrate 21) through the gap g (between the capacitor 26T and the substrate 21) and which has reached the third regulation portion 44), moves above the second cover portion 45 through the space J2. The air that has moved above the second cover portion 45 flows along an upper surface of the second cover portion 45. As a result, the cooling of the second cover portion 45 is improved. That is, in at least one embodiment, the flow of the air is divided into two on a downstream side of the third regulation portion 44, and the second cover portion 45 is cooled from above and below. As a result, heat dissipation of the second cover portion 45 is efficiently performed. Here, when at least a part of the third regulation portion 44 is inclined with respect to the Z direction, pressure loss is less likely to occur in the flow of the air moving above the second cover portion 45 through the space J2. Therefore, good flow of the air is easily formed above and below the second cover portion 45. Thereby, the cooling of the inner plate 40 is further improved.

The air that has passed through the second cover portion 45 is discharged from the ventilation hole 14*h* of the second side wall 14 of the housing 10 to the outside of the housing 10.

7. Another Environment (Second Environment)

Figure 8:
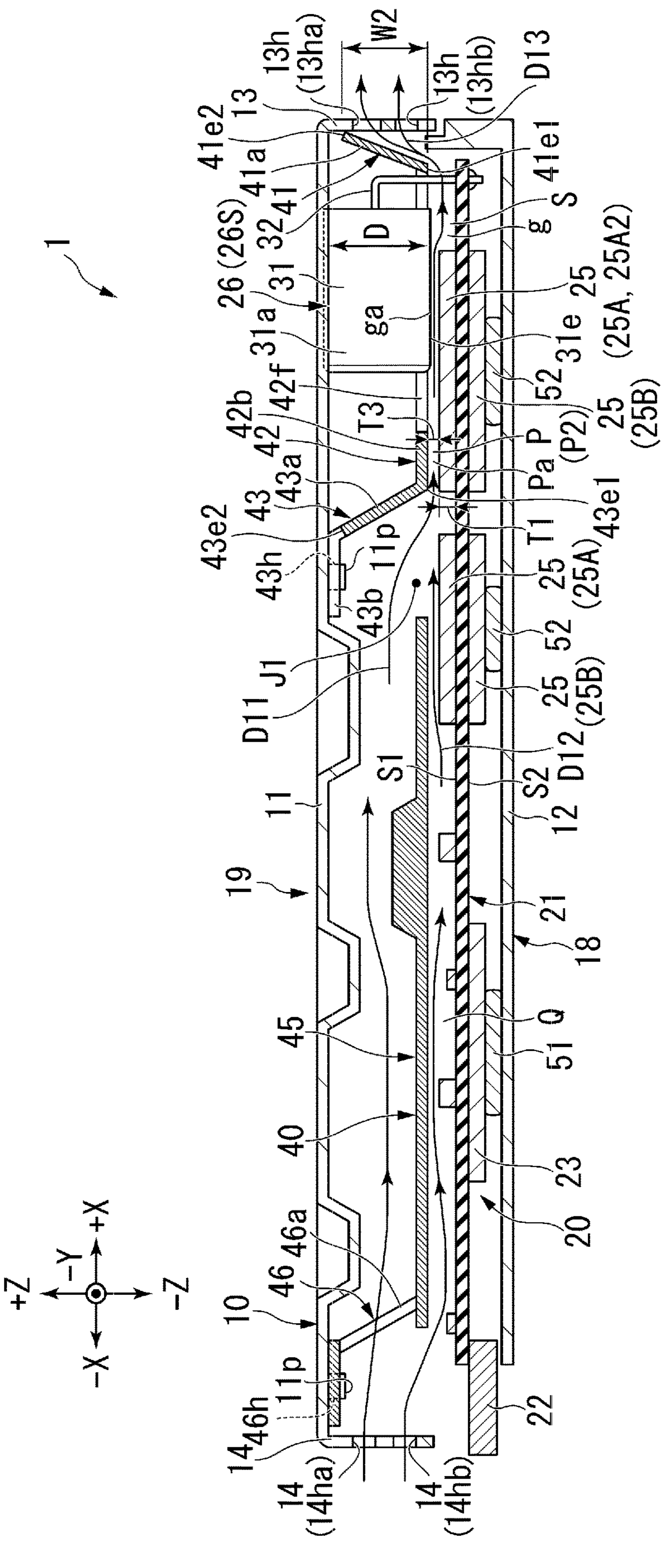
FIG. 8 is a cross-sectional view showing a second environment of the semiconductor storage device of the embodiment.
Figure 9:
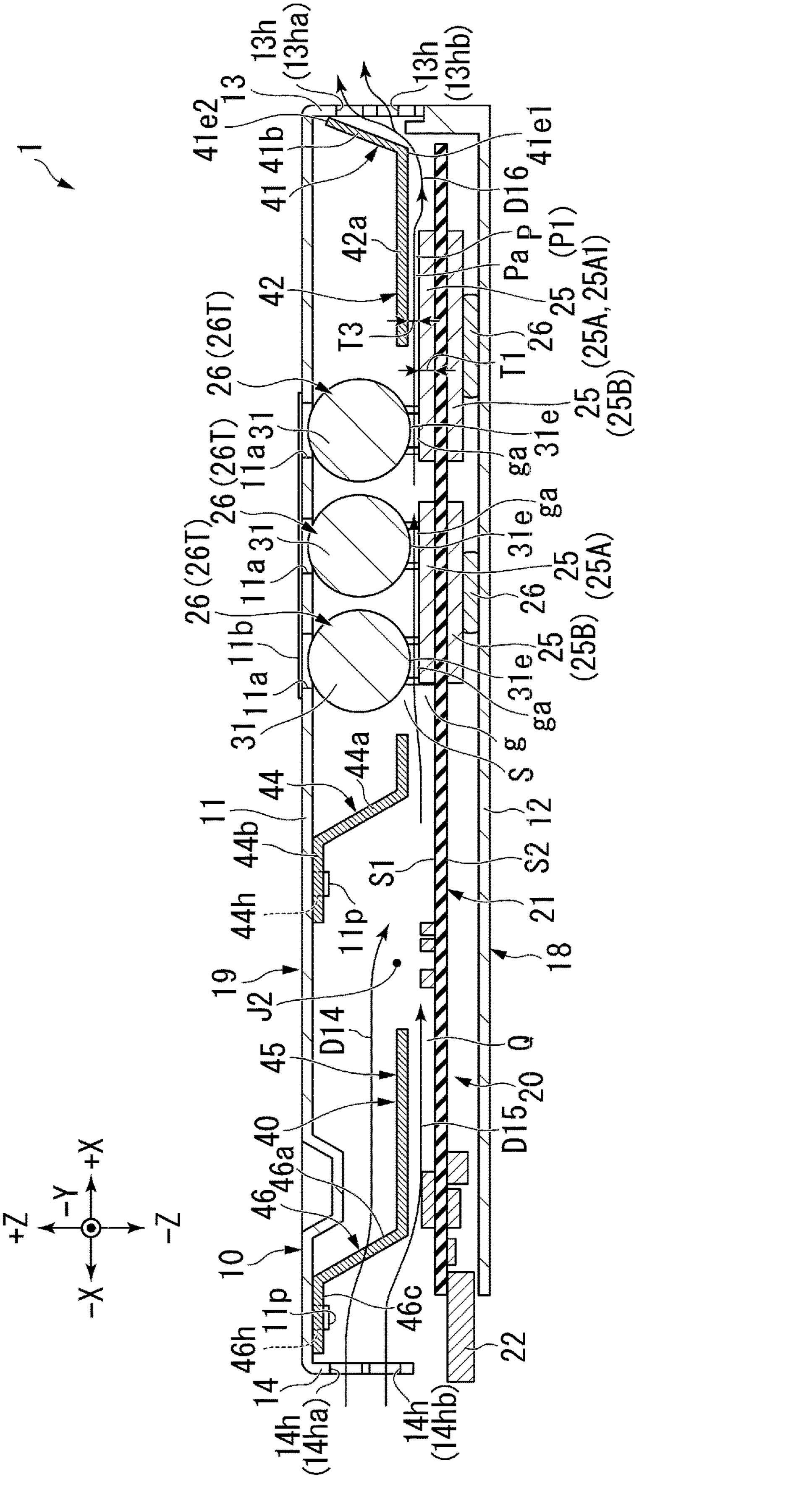
FIG. 9 is a cross-sectional view showing the second environment of the semiconductor storage device of the embodiment.

FIGS. 8 and 9 are cross-sectional views showing the second environment of the semiconductor storage device 1. The semiconductor storage device 1 of at least one embodiment may be used in an environment in which the air (cooling air) flows in the +X direction as shown in FIG. 8 instead of the environment in which the air (cooling air) flows in the −X direction as described above.

Describing the flow of the air related to the capacitor 26S, as shown in FIG. 8, the cooling air flows into the housing 10 from the outside of the housing 10 through the ventilation hole 14*h* of the second side wall 14 of the housing 10. At least a part of the air that has flowed into the housing 10 collides with the second regulation portion 43. The flow direction of the air, which has flowed in, is changed so as to flow along the second regulation portion 43. The air that flows along the second regulation portion 43 is supplied to the gap g between the component main body 31 of the capacitor 26S and the substrate 21 (see an arrow D11). As a result, a flow rate of the air flowing below the component main body 31 of the capacitor 26S is increased. As a result, cooling of the semiconductor memory 25A, which is located below the component main body 31 of the capacitor 26S, is improved.

In at least one embodiment, the second regulation portion 43 guides at least a part of the air, which flows inside the housing 10, toward the gap S between the capacitor 26 and the substrate 21. For example, the second regulation portion 43 guides at least a part of the air, which flows inside the housing 10, toward the gap g between the component main body 31 of the capacitor 26 and the substrate 21. Therefore, the second regulation portion 43 guides at least a part of the air, which flows inside the housing 10, toward the gap ga between the component main body 31 of the capacitor 26 and the semiconductor memory 25A. For example, the second regulation portion 43 guides at least a part of the air, which flows inside the housing 10, toward the gap g between the component main body 31 of the capacitor 26 and the substrate 21 at a location on an upstream side of the gap ga between the component main body 31 of the capacitor 26 and the semiconductor memory 25A. Therefore, the second regulation portion 43 guides at least a part of the air, which flows inside the housing 10, toward the gap ga between the component main body 31 of the capacitor 26 and the semiconductor memory 25A. For example, a part of the air supplied to the gap g between the component main body 31 of the capacitor 26S and the substrate 21 flows through the gap ga between the component main body 31 of the capacitor 26S and the semiconductor memory 25A, thereby the cooling of the semiconductor memory 25A is improved.

In at least one embodiment, another part of the air that has flowed into housing 10 may flow into the gap g between the component main body 31 of capacitor 26S and the substrate 21 (see an arrow D12) through the flow path Q between the second cover portion 45 and the substrate 21. The air, which has passed through the gap g between the component main body 31 of the capacitor 26S and the substrate 21, is discharged from the ventilation hole 13*h* of the first side wall 13 of the housing 10 to the outside of the housing 10 (see an arrow D13).

Next, describing the flow of the air related to the capacitor 26T, as shown in FIG. 9, at least a part of the air that has flowed into the housing 10 collides with the third regulation portion 44. The flow direction of the air, which has flowed in, is changed so as to flow along the third regulation portion 44. The air that flows along the third regulation portion 44 is supplied to the gap g between the component main body 31 of the capacitor 26T and the substrate 21 (see an arrow D14). As a result, a flow rate of the air flowing below the component main body 31 of the capacitor 26T is increased. As a result, cooling of the semiconductor memory 25A, which is located below the component main body 31 of the capacitor 26T, is improved.

In at least one embodiment, the third regulation portion 44 guides at least a part of the air, which flows inside the housing 10, toward the gap S between the capacitor 26 and the substrate 21. For example, the third regulation portion 44 guides at least a part of the air, which flows inside the housing 10, toward the gap g between the component main body 31 of the capacitor 26 and the substrate 21. Therefore, the third regulation portion 44 guides at least a part of the air, which flows inside the housing 10, toward the gap ga between the component main body 31 of the capacitor 26 and the semiconductor memory 25A. For example, the third regulation portion 44 guides at least a part of the air, which flows inside the housing 10, toward the gap g between the component main body 31 of the capacitor 26 and the substrate 21 at a location on an upstream side of the gap ga between the component main body 31 of the capacitor 26 and the semiconductor memory 25A. Therefore, the second regulation portion 43 guides at least a part of the air, which flows inside the housing 10, toward the gap ga between the component main body 31 of the capacitor 26 and the semiconductor memory 25A. For example, a part of the air supplied to the gap g between the component main body 31 of the capacitor 26T and the substrate 21 flows through the gap ga between the component main body 31 of the capacitor 26T and the semiconductor memory 25A, thereby the cooling of the semiconductor memory 25A is improved.

In at least one embodiment, another part of the air that has flowed into housing 10 may flow into the gap g between the component main body 31 of capacitor 26T and the substrate 21 (an arrow D15) through the flow path Q between the second cover portion 45 and the substrate 21. The air, which has passed through the gap g between the component main body 31 of the capacitor 26T and the substrate 21, is discharged from the ventilation hole 13*h* of the first side wall 13 of the housing 10 to the outside of the housing 10 (an arrow D16).

8. Advantages

As a comparative example, an internal structure of a semiconductor storage device without the first regulation portion 41 will be described. In this structure, for the semiconductor memory 25 that does not overlap the capacitor 26, a necessary size heat conduction member can be attached and good heat dissipation can be achieved via the heat conduction member, the inner plate, and the housing. However, for the semiconductor memory 25 located below the capacitor 26, it may be difficult to secure a heat connection structure to the housing, and it may be difficult to dissipate heat sufficiently.

Therefore, in at least one embodiment, the semiconductor storage device 1 includes the first regulation portion 41 that guides at least a part of the air, which flows inside the housing 10, toward the gap S between the capacitor 26 and the substrate 21. According to such a configuration, the air in the housing 10 is guided by the first regulation portion 41 toward the gap S between the capacitor 26 and the substrate 21, increasing the flow rate of the air flowing below the capacitor 26. As a result, the heat dissipation of the semiconductor memory 25 that is located below the capacitor 26 can be improved, and the heat dissipation property of the semiconductor storage device 1 can be improved.

In at least one embodiment, at least a part of the first regulation portion 41 is inclined with respect to the Z direction. According to such a configuration, a large amount of air can be guided toward the gap S between the capacitor 26 and the substrate 21 by the first regulation portion 41. As a result, the heat dissipation property of the semiconductor storage device 1 can be further improved.

In at least one embodiment, the housing 10 includes one or more ventilation holes 13*h* that are open in the X direction. The first regulation portion 41 is disposed between the capacitor 26 and the one or more ventilation holes 13*h* in the X direction, and overlaps the one or more ventilation holes 13*h* when viewed in the X direction. According to such a configuration, at least a part of the air that flows into the housing 10 from the ventilation hole 13*h* can be more reliably guided toward the gap S between the capacitor 26 and the substrate 21. As a result, the heat dissipation property of the semiconductor storage device 1 can be further improved.

In at least one embodiment, the semiconductor storage device 1 includes the first cover portion 42 overlapping the substrate 21 when viewed in the Z direction. The first cover portion 42 extends parallel to the substrate 21 from at least a part of the lower end 41*e*1 of the first regulation portion 41. According to such a configuration, the air, which is guided near the substrate 21 by the first regulation portion 41, can be guided on a downstream side as a flow along the vicinity of the substrate 21. Thereby, efficient heat dissipation of the substrate 21 can be improved.

In at least one embodiment, the first cover portion 42 is provided at least a part around the capacitor 26, avoiding the area overlapping the capacitor 26 when viewed in the Z direction. According to such a configuration, the size (for example, reduction of the thickness) of the semiconductor storage device can be reduced as compared with the structure in which the capacitor 26 and the first cover portion 42 overlap each other.

In at least one embodiment, the semiconductor storage device 1 includes the second regulation portion 43 that is disposed on the side opposite to the first regulation portion 41 with respect to the capacitor 26 in the X direction. At least a part of the second regulation portion 43 is inclined on the side opposite to the first regulation portion 41 with respect to the Z direction. According to such a configuration, air can be supplied to the gap S between the capacitor 26 and the substrate 21 both in an environment in which air flows in the −X direction and in an environment in which air flows in the +X direction. Further, when at least a part of the second regulation portion 43 is inclined with respect to the X direction, the fixed portion 43*b* for fixing the inner plate 40 to the housing 10 can be disposed near the first main wall 11 of the housing 10.

In at least one embodiment, the first cover portion 42 connects at least a part of the lower end 41*e*1 of the first regulation portion 41 and at least a part of the lower end 43*e*1 of the second regulation portion 43. According to such a configuration, in both the environment in which air flows in the −X direction and the environment in which air flows in the +X direction, the air, which is guided near the substrate 21 by the first regulation portion 41 or the second regulation portion 43, can flow along the substrate 21. Thereby, efficient heat dissipation of the substrate 21 can be improved.

In at least one embodiment, the semiconductor storage device 1 is disposed on the side opposite to the capacitor 26 with respect to the second regulation portion 43 in the X direction, and includes the second cover portion 45 that overlaps the heat-generating component (for example, the DRAM 24) when viewed in the Z direction. The second cover portion 45 is disposed with a space J1, where a part of the air in the housing 10 is movable in the Z direction, between at least a part of the second cover portion 45 and the second regulation portion 43. According to such a configuration, a part of the air that has reached the second regulation portion 43 flows above the second cover portion 45 through the space J1. As a result, the cooling of the second cover portion 45 is improved. As a result, the heat dissipation from the heat-generating component (for example, the DRAM 24) that is located below the second cover portion 45 can be further improved.

Further, when at least a part of the second regulation portion 43 is inclined with respect to the Z direction (for example, the inclined portion 43*a*), pressure loss is less likely to occur in the flow of the air moving above the second cover portion 45 through the space J1. Therefore, it becomes easier to form a good flow of air above and below the second cover portion 45 by providing the space J1 adjacent to the second regulation portion 43.

Although one embodiment has been described above, the embodiment is not limited to the above example. For example, one or more of the first regulation portion 41, the second regulation portion 43, and the third regulation portion 44 may be provided in the housing 10 instead of being provided in the inner plate 40, and may be provided in the substrate 21.

According to at least one embodiment described above, the semiconductor storage device includes a regulating plate that guides at least a part of the air, which flows inside the housing, toward the gap between the capacitor and the substrate. With such a configuration, the heat dissipation property of the semiconductor storage device can be achieved.

While certain embodiments have been described, these embodiments have been presented by way of example only, and are not intended to limit the scope of the disclosure. Indeed, the novel embodiments described herein may be embodied in a variety of other forms; furthermore, various omissions, substitutions and changes in the form of the embodiments described herein may be made without departing from the spirit of the disclosure. The accompanying claims and their equivalents are intended to cover such forms or modifications as would fall within the scope and spirit of the disclosure.

What is claimed is:

1. A semiconductor storage device comprising:

a housing;

a substrate positioned in the housing;

a first semiconductor component on the substrate;

a capacitor on the substrate, the capacitor including a portion overlapping the first semiconductor component from a side opposite to the substrate when viewed from a first direction, the first direction being a thickness direction of the substrate; and a first inclined plate disposed in the housing, a second inclined plate located on a side opposite to the first inclined plate with respect to the capacitor in the second direction, wherein the housing includes one or more ventilation holes open in a second direction different from the first direction, the first inclined plate is disposed between the capacitor and the one or more ventilation holes in the second direction, and the first inclined plate being inclined with respect to the first direction to move closer to the one or more ventilation holes as the first inclined plate is moved away from the substrate, the second inclined plate is inclined to a side opposite to the first inclined plate with respect to the first direction.

2. The semiconductor storage device according to claim 1, further comprising:

a first cover plate overlapping the substrate when viewed from the first direction, wherein the first inclined plate includes a plurality of ends, the plurality of ends include a first end closest to the substrate in the first direction, and the first cover plate extends parallel to the substrate from at least a part of the first end.

3. The semiconductor storage device according to claim 2, wherein the first cover plate is provided on at least a part around the capacitor, avoiding an area overlapping the capacitor when viewed from the first direction.

4. A semiconductor storage device comprising:

a housing;

a substrate positioned in the housing;

a first semiconductor component on the substrate;

a capacitor on the substrate, the capacitor including a first portion overlapping the first semiconductor component from a side opposite to the substrate when viewed from a first direction, the first direction being a thickness direction of the substrate;

a first regulating plate arranged to guide at least some air that flows inside the housing toward a first gap between the capacitor and the substrate; and a second regulating plate disposed on a side opposite to the first regulating plate with respect to the capacitor in a second direction different from the first direction, wherein at least a part of the first regulating plate is inclined with respect to the first direction, and at least a part of the second regulating plate is inclined to a side opposite to the first regulating plate with respect to the first direction.

5. The semiconductor storage device according to claim 4, wherein the housing includes one or more ventilation holes open in a second direction different from the first direction, and the first regulating plate disposed between the capacitor and the one or more ventilation holes in the second direction and overlapping the one or more ventilation holes when viewed from the second direction.

6. The semiconductor storage device according to claim 4, wherein the capacitor includes a cylindrical-shaped component main body with a central axis along a second direction different from the first direction, and a lead protruding from the component main body and being connected to the substrate, the component main body overlaps the first semiconductor component from the side opposite to the substrate when viewed from the first direction, and the first regulating plate is arranged to guide the at least some air that flows inside the housing toward a second gap between the component main body and the substrate.

7. The semiconductor storage device according to claim 4, further comprising:

a first cover plate overlapping the substrate when viewed from the first direction, wherein the first regulating plate includes a plurality of ends, the plurality of ends include a first end closest to the substrate in the first direction, and the first cover plate extends parallel to the substrate from at least a part of the first end of the first regulating plate.

8. The semiconductor storage device according to claim 7, wherein the first cover plate is disposed on at least a part around the capacitor, avoiding an area overlapping the capacitor when viewed from the first direction.

9. The semiconductor storage device according to claim 7, wherein the first cover plate includes a cut-out portion that is larger than the capacitor, and the capacitor is disposed in the cut-out portion, so that a disposition height of the first cover plate with respect to the substrate is a same as a part of the capacitor.

10. The semiconductor storage device according to claim 7, further comprising a first heat conduction member disposed between the first cover plate and the first semiconductor component.

11. The semiconductor storage device according to claim 10, further comprising:

a second semiconductor component mounted on the substrate; and a second heat conduction member disposed between the first cover plate and the second semiconductor component.

12. The semiconductor storage device according to claim 11, further comprising:

a third semiconductor component mounted on the substrate;

a second cover plate disposed on a side opposite to the capacitor with respect to the second regulating plate in the second direction, and overlapping the third semiconductor component when viewed from the first direction; and a third heat conduction member disposed between the second cover plate and the third semiconductor component, wherein the second cover plate is disposed with a space, where the at least some air in the housing is movable in the first direction, between at least a part of the second cover plate and the second regulating plate.

13. The semiconductor storage device according to claim 12, further comprising:

a fourth semiconductor component mounted on the substrate;

an inner plate disposed between the substrate and an inner surface of the housing; and a fourth heat conduction member disposed between the inner plate and the fourth semiconductor component, wherein the first regulating plate is provided as a part of the inner plate.

14. The semiconductor storage device according to claim 4, further comprising:

a first cover plate overlapping the substrate when viewed from the first direction, wherein the first regulating plate includes a first plurality of ends, and the first plurality of ends include a first end closest to the substrate in the first direction, the second regulating plate includes a second plurality of ends, and the second plurality of ends include a second end closest to the substrate in the first direction, and the first cover plate connects at least a part of the first end and at least a part of the second end.

15. The semiconductor storage device according to claim 4, wherein the capacitor includes a cylindrical-shaped component main body with a central axis along a second direction different from the first direction, and a lead protruding from the component main body and connected to the substrate, the first gap including a third gap between the component main body and the first semiconductor component, and the first regulating plate arranged to guide the at least some air, which flows inside the housing, toward the third gap.

* * * * *